United States Patent
Vidal Puente et al.

(10) Patent No.: US 11,509,351 B2
(45) Date of Patent: Nov. 22, 2022

(54) EARTH FAULT LOCALIZATION

(71) Applicant: Carrier Corporation, Palm Beach Gardens, FL (US)

(72) Inventors: Javier Vidal Puente, Badalona (ES); Jordi Escofet Via, Barcelona (ES); Jordi Castells Moreno, Barcelona (ES); Sherry Sun, Beijing (CN)

(73) Assignee: CARRIER CORPORATION, Palm Beach Gardens, FL (US)

( * ) Notice: Subject to any disclaimer, the term of this patent is extended or adjusted under 35 U.S.C. 154(b) by 45 days.

(21) Appl. No.: 16/638,170

(22) PCT Filed: Aug. 9, 2018

(86) PCT No.: PCT/US2018/045955
§ 371 (c)(1),
(2) Date: Feb. 11, 2020

(87) PCT Pub. No.: WO2019/032796
PCT Pub. Date: Feb. 14, 2019

(65) Prior Publication Data
US 2021/0148991 A1  May 20, 2021

(30) Foreign Application Priority Data
Aug. 11, 2017 (EP) .................................. 17382565

(51) Int. Cl.
*H04B 3/46* (2015.01)
*G01R 31/52* (2020.01)
*H04L 12/437* (2006.01)

(52) U.S. Cl.
CPC .............. *H04B 3/46* (2013.01); *G01R 31/52* (2020.01); *H04L 12/437* (2013.01)

(58) Field of Classification Search
CPC .......... G01R 31/52; H04B 3/46; H04L 12/437
See application file for complete search history.

(56) References Cited

U.S. PATENT DOCUMENTS 3,323,018 A  5/1967 Roth
4,091,363 A  5/1978 Siegel et al.
(Continued)

FOREIGN PATENT DOCUMENTS

CN  205210136 U  5/2016
EP  0967833 A2  12/1999
(Continued)

OTHER PUBLICATIONS

Advanced Fire Systems Inc., "Axis—Intelligent Loop Isolator & Isolating Detector Bases", available at: https://us.advancedco.com/media/1850362/Intelligent%20Loop%20Isolator%20&%20Isolating%20Base.pdf, accessed Feb. 7, 2020, 2 pages.
(Continued)

*Primary Examiner* — Akm Zakaria
(74) *Attorney, Agent, or Firm* — Cantor Colburn LLP

(57) ABSTRACT

A method and system of determining the location of an earth fault within a loop of devices is disclosed. Upon the detection of an earth fault within the loop comprising a plurality of devices, a first device within the loop is isolated along with a second device. While the first device and the second device are isolated, it is determined if the earth fault still exists. If the earth fault no longer exists, then determine that the earth fault is located between the first device and the second device. This can be iterated through each adjacent pair of devices in the loop to localize the earth fault between the devices.

10 Claims, 6 Drawing Sheets

(56) References Cited

U.S. PATENT DOCUMENTS

| | | |
|---|---|---|
| 4,954,809 A | 9/1990 | Right et al. |
| 5,086,293 A | 2/1992 | Takahashi et al. |
| 5,097,259 A | 3/1992 | Testa et al. |
| RE34,643 E | 6/1994 | Payne |
| 5,400,203 A | 3/1995 | Tice |
| 5,631,795 A | 5/1997 | Koyama |
| 5,644,293 A | 7/1997 | Right et al. |
| 5,801,913 A | 9/1998 | Pittel |
| 6,292,541 B1 | 9/2001 | Tice et al. |
| 6,313,744 B1 | 11/2001 | Capowski et al. |
| 6,426,697 B1 | 7/2002 | Capowski |
| 6,590,755 B1 | 7/2003 | Behr et al. |
| 6,826,027 B2 | 11/2004 | Galgay |
| 7,046,013 B2 | 5/2006 | Uematsu et al. |
| 7,535,687 B2 | 5/2009 | Costa |
| 7,978,089 B2 | 7/2011 | Salgueiro et al. |
| 8,373,420 B2 | 2/2013 | Lupaczyk et al. |
| 8,675,324 B2 | 3/2014 | Noguchi |
| 8,804,291 B2 | 8/2014 | Becker et al. |
| 9,153,968 B2 | 10/2015 | Meah et al. |
| 9,197,339 B2 | 11/2015 | Jonkman |
| 9,319,101 B2 | 4/2016 | Lontka |
| 2013/0307556 A1* | 11/2013 | Ledenev ............... H02S 50/10 324/509 |
| 2015/0113328 A1* | 4/2015 | Jiang ..................... H04L 41/12 714/37 |
| 2016/0041216 A1 | 2/2016 | Tang et al. |
| 2016/0132089 A1 | 5/2016 | Tenca et al. |
| 2016/0139192 A1* | 5/2016 | Okerman ............... G01R 31/52 324/509 |
| 2016/0238649 A1 | 8/2016 | Edwards |

FOREIGN PATENT DOCUMENTS

| | | |
|---|---|---|
| GB | 2319408 A | 5/1998 |
| GB | 2326780 A | 12/1998 |
| WO | 2011117168 A1 | 9/2011 |

OTHER PUBLICATIONS

Apollo Fire Detectors Ltd., "Short-circuit Isolation in Addressable Fire Detection and Alarm Systems", PP2090/2019/Issue 20, 2019, 4 pages.

European Search Report for application EP 17382565.4, dated Jun. 26, 2018, 11 pages.

International Search Report and Written Opinion for application PCT/US2018/045955, dated Nov. 20, 2018, 15 pages.

System Sensor, "B524BI and B224BI Plug-In Isolator Detector Bases" www.systemsensor.com, 2016, 6 pages.

* cited by examiner

EARTH FAULT LOCALIZATION

BACKGROUND

The present disclosure relates in general to electronics. More specifically, this disclosure describes the localization of earth faults in a loop of devices.

A low-power electronic system can have multiple devices connected to a loop in order to provide varying functionality. For example, an alarm system can have multiple sensors, alarms, cameras, and other devices coupled together. In systems of the past, it was possible to determine the existence of an earth fault within a loop of devices. However, determining the actual location of the earth fault was a tedious manual process of examining each device in the loop and the wiring in between each device.

SUMMARY

According to one embodiment, a method includes upon the detection of an earth fault within a loop comprising a plurality of devices, isolating a first device within the loop; isolating a second device within the loop; while the first device and the second device are isolated, determining if the earth fault still exists; if the earth fault no longer exists, then determining that the earth fault is located between the first device and the second device.

In addition to one or more of the features described above, or as an alternative, further embodiments may include wherein: the loop further comprises a controller; and the controller performs the detection of the earth fault.

In addition to one or more of the features described above, or as an alternative, further embodiments may further comprise: iterating the isolating and determining through each device within the loop.

In addition to one or more of the features described above, or as an alternative, further embodiments may further comprise: determining a number of devices in the loop; wherein: iterating comprises: assigning a unique index number to each device of the plurality of devices in the loop; starting a counter N at the first unique index number; isolating device N and device N+1; and in the event the earth fault still exists, removing isolation between device N and device N+1 and incrementing N.

In addition to one or more of the features described above, or as an alternative, further embodiments may include wherein iterating further comprises: repeating the isolating and incrementing steps until the ground fault is no longer detected.

In addition to one or more of the features described above, or as an alternative, further embodiments may include wherein iterating further comprises: repeating the isolating and incrementing steps until N is equal to the number of devices in the loop.

In addition to one or more of the features described above, or as an alternative, further embodiments may include wherein detecting the earth fault comprises determining if current flowing through a positive leg of the loop is equal to the current flowing through a negative leg of the loop.

According to one embodiment, a system includes a loop comprising a plurality of devices, each device including an isolator; logic configured to: upon the detection of an earth fault within a loop comprising a plurality of devices, isolate a first device within the loop; isolate a second device within the loop; while the first device and the second device are isolated, determine if the earth fault still exists; if the earth fault no longer exists, then determine that the earth fault is located between the first device and the second device.

In addition to one or more of the features described above, or as an alternative, further embodiments may include wherein: the loop further comprises a controller; and the controller performs the detection of the earth fault.

In addition to one or more of the features described above, or as an alternative, further embodiments may further comprise: iterating the isolating and determining through each device within the loop.

In addition to one or more of the features described above, or as an alternative, further embodiments may further comprise: determining a number of devices in the loop; wherein: iterating comprises: assigning a unique index number to each device of the plurality of devices in the loop; starting a counter N at the first unique index number; isolating device N and device N+1; and in the event the earth fault still exists, removing isolation between device N and device N+1 and incrementing N.

In addition to one or more of the features described above, or as an alternative, further embodiments may include wherein iterating further comprises: repeating the isolating and incrementing steps until the ground fault is no longer detected.

In addition to one or more of the features described above, or as an alternative, further embodiments may include wherein iterating further comprises: repeating the isolating and incrementing steps until N is equal to the number of devices in the loop.

In addition to one or more of the features described above, or as an alternative, further embodiments may include wherein each device in the loop includes an isolator comprising a plurality of switches configured to isolate the device from other devices in the loop.

According to one embodiment, a computer program product comprises a computer readable storage medium having program instructions embodied therewith, wherein the computer readable storage medium is not a transitory signal per se, the program instructions executable by a processor to cause the processor to: upon the detection of an earth fault within a loop comprising a plurality of devices, isolating a first device within the loop; isolating a second device within the loop; while the first device and the second device are isolated, determining if the earth fault still exists; if the earth fault no longer exists, then determining that the earth fault is located between the first device and the second device.

In addition to one or more of the features described above, or as an alternative, further embodiments may include wherein: the loop further comprises a controller; and the controller performs the detection of the earth fault.

In addition to one or more of the features described above, or as an alternative, further embodiments may further comprise: iterating the isolating and determining through each device within the loop.

In addition to one or more of the features described above, or as an alternative, further embodiments may further comprise: determining a number of devices in the loop; wherein: iterating comprises: assigning a unique index number to each device of the plurality of devices in the loop; starting a counter N at the first unique index number; isolating device N and device N+1; and in the event the earth fault still exists, removing isolation between device N and device N+1 and incrementing N.

In addition to one or more of the features described above, or as an alternative, further embodiments may include wherein iterating further comprises: repeating the isolating and incrementing steps until the ground fault is no longer detected.

In addition to one or more of the features described above, or as an alternative, further embodiments may include wherein iterating further comprises: repeating the isolating and incrementing steps until N is equal to the number of devices in the loop.

Technical effects of embodiments of the disclosure include a system that allows the localization of earth faults in a loop of devices.

These and other advantages and features will become more apparent from the following description taken in conjunction with the drawings.

Additional features are realized through the techniques of the present disclosure. Other embodiments are described in detail herein and are considered a part of the claims. For a better understanding of the disclosure with the features, refer to the description and to the drawings.

BRIEF DESCRIPTION OF THE DRAWINGS

The subject matter which is regarded as the disclosure is particularly pointed out and distinctly claimed in the claims at the conclusion of the specification. The forgoing features are apparent from the following detailed description taken in conjunction with the accompanying drawings in which:

Figure 1:
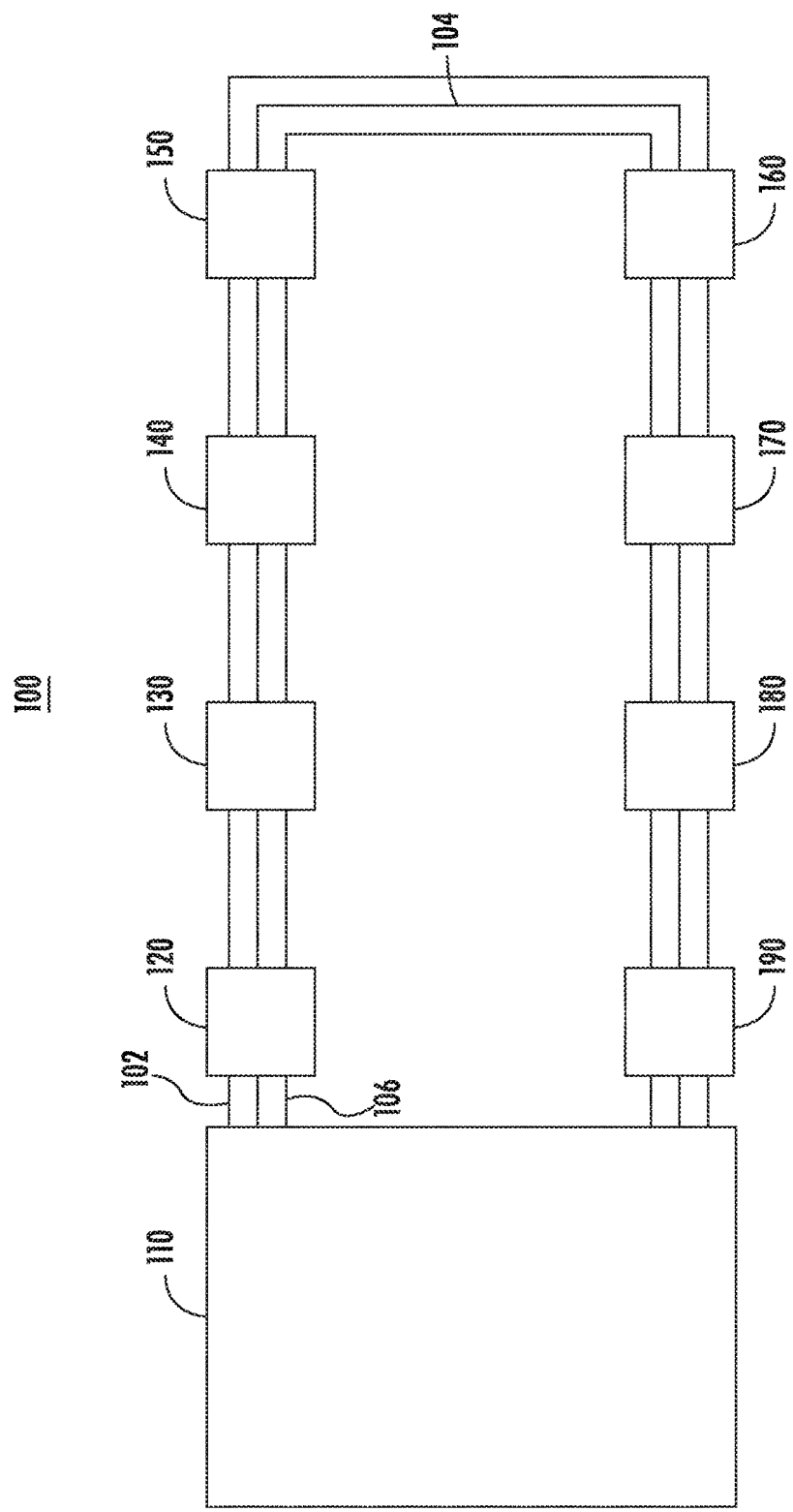
FIG. 1 is a block diagram illustrating an exemplary low-power loop of devices of one or more embodiments.

It should be understood that the drawings are not necessarily to scale and that the disclosed embodiments are sometimes illustrated diagrammatically and in partial views. In certain instances, details which are not necessary for an understanding of this disclosure or which render other details difficult to perceive may have been omitted. It should be understood that this disclosure is no limited to the particular embodiments illustrated herein.

DETAILED DESCRIPTION

Various embodiments will now be described with reference to the related drawings. Alternate embodiments may be devised without departing from the scope of this detailed description. Various connections might be set forth between elements in the following description and in the drawings. These connections, unless specified otherwise, may be direct or indirect, and the present description is not intended to be limiting in this respect. Accordingly, a coupling of entities may refer to either a direct or an indirect connection.

In a house or building, there can be various electrical systems. Systems such as lighting and power outlets run at a higher voltage, such as 120 volts or 240 volts, depending on the region and the type of power outlets being used. There can also be a low-power system used for separate purposes. Exemplary low-power circuits can include lighting, sensors, alarms, and the like, running at voltages such as 12, 24, or 42 volts.

Referring to FIG. 1, a block diagram of an exemplary low-power system 100 is illustrated. Control unit 110 is coupled to eight devices 120, 130, 140, 150, 160, 170, 180, and 190. In exemplary system 100, there are three wires coupling together each device, a positive voltage line 102, a negative voltage line 104, and an earth (also known as ground) line 106. In some embodiments, there can be more or fewer wires coupling together the devices. There are many different situations in which low-power systems can be used. For example, some alarm/monitoring systems use low-power devices. In such an embodiment, controller (also known as a control unit) 110 can be an alarm junction box. Devices 120 through 190 can be devices such as smoke detectors, fire alarm, fire lights, sirens, carbon monoxide sensors, intrusion sensors, door sensors, audio/visual devices, and the like.

One cause of an earth fault (or ground fault) exists when one of positive voltage line 102 or negative voltage line 104 is accidentally coupled to earth line 106. Other causes are also possible, such as an accidental contact of positive or negative line to a ground or earth in the neighborhood of the loop. The result is that some of devices 120, 130, 140, 150, 160, 170, 180, or 190 could not be operable. In addition, damage can possibly occur to the devices due to this condition. While there exists technology that allows control unit 110 to detect a ground fault and possibly protect each of the devices from damage, the location of the earth fault cannot be sensed. Therefore, to repair such an earth fault requires a time consuming analysis of every device in the system and the associated wiring. While only eight devices are shown in FIG. 1, in a real-world embodiment of such a system, there could be dozens or hundreds of devices, spread over multiple floors of a building, coupled together by hundreds or thousands of meters of wiring. Locating and repairing an earth fault in a more efficient manner is desirable.

Turning now to an overview of an embodiment, each device in a loop of devices contains an isolator that allows sections of the loop to be isolated. Thereafter, each device in the loop of devices can be isolated to determine if an earth fault is present. By iterating through each device in a loop of devices, the location of an earth fault can be narrowed down.

Figure 2:
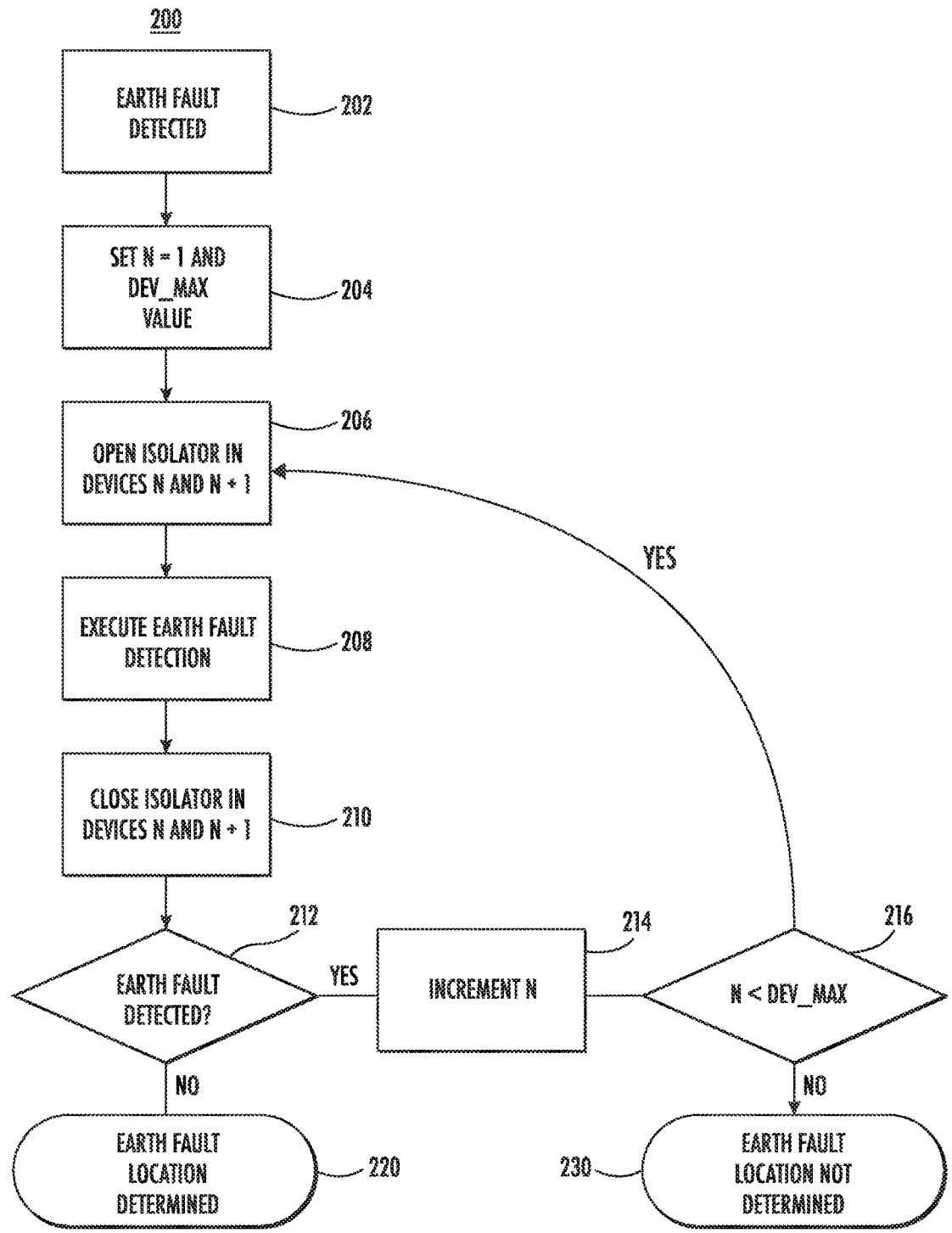
FIG. 2 is a flowchart illustrating the operation of one or more embodiments.

Turning now to a more detailed description of aspects of the present invention, FIG. 2 depicts a flowchart illustrating a method 200 according to embodiments of the invention. Method 200 is merely exemplary and is not limited to the embodiments presented herein. Method 200 can be employed in many different embodiments or examples not specifically depicted or described herein. In some embodiments, the procedures, processes, and/or activities of method 200 can be performed in the order presented. In other embodiments, one or more of the procedures, processes, and/or activities of method 200 can be combined or skipped. In some embodiments, method 200 can be performed by a computer system, such as computer system 300.

An earth fault is detected in a loop (block 202). Various methods can be used to detect the earth fault. An exemplary circuit to detect an earth fault is set forth below. A counter, N, is set to 1. The value of DEV_MAX is set to the number of devices in the loop (block 204). The devices in the loop are numbered in incremental order. In some embodiments, devices that are closer to the control unit are assigned smaller numbers than devices that are farther from the control unit. An isolator is opened in device N+1 and an isolator is opened in device N (block 206). The earth fault detector is operated again (block 208). Thereafter, the isolator in device N+1 and the isolator in device N are closed (block 210).

It is determined if the earth fault still exists (block 212). If the earth fault still exists, then the location of the earth fault still must be determined. The value of N is incremented (block 214). If N is less than DEV_MAX then operation can continue at block 206. Otherwise, the earth fault is not located in this particular loop (block 230). It should be understood that, in some installations, several loops can be coupled together. Thus, an earth fault detected in on loop may actually exist in another loop.

If the earth fault does not exist, then it is known that the earth fault is located between device N and device N+1 (block 220).

By following method 200, one is able to isolate each device in a loop in succession. Returning to FIG. 1, first, device 120 is isolated. An earth fault detection is performed. If the earth fault detection still shows, then it is known that the earth fault still exists. Therefore, second device 130 is isolated and the same blocks take place. If, for example, the earth fault disappears when device 150 is isolated, then it is known that the earth fault is located somewhere between device 150 and device 160. Thereafter, one can more precisely locate the earth fault and make repairs to fix the earth fault.

Figure 5:
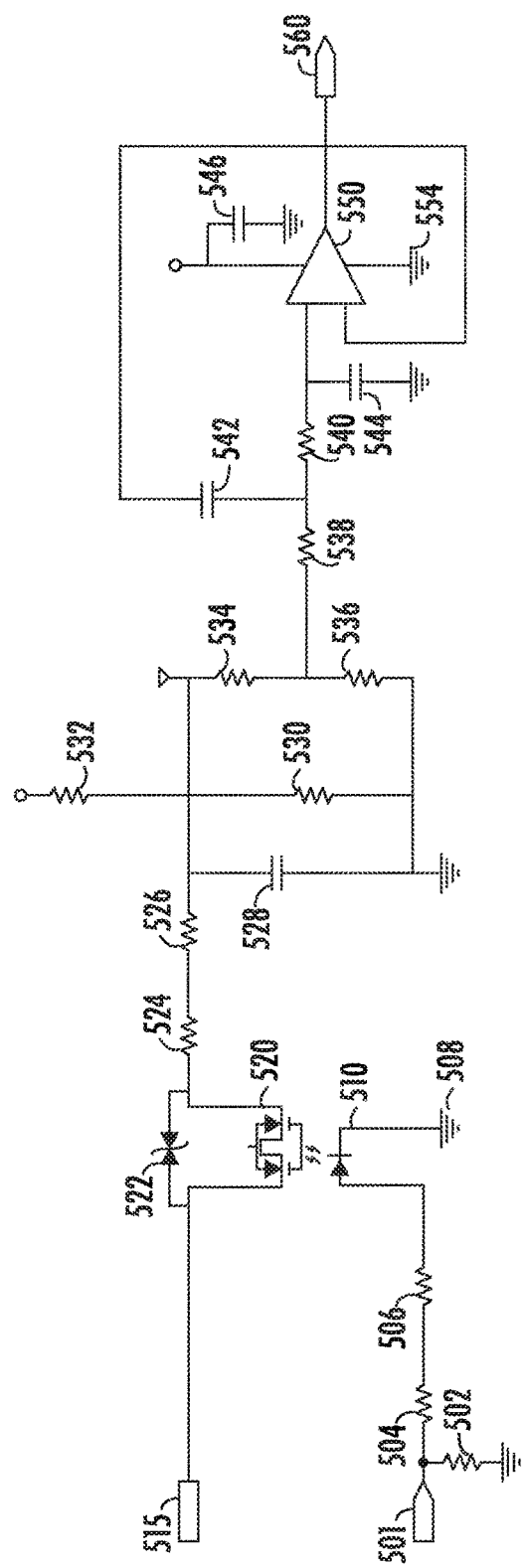
FIG. 5 is an exemplary schematic diagram of an exemplary earth fault detector of one or more embodiments.

With reference to FIG. 5, an exemplary circuit 500 used to detect earth faults is illustrated. It should be understood that any type of circuit that can be used to detect earth faults can be used in various embodiments. FIG. 5 only presents one such circuit. Circuit 500 compares current flowing in the output to the input current. If the deviation is beyond a certain threshold, an alert can be triggered.

In circuit 500, the alert is in the form of output 560. However, any alert can be created. Exemplary alerts can include a signal propagated to a different circuit for alarm purposes. Optocoupler 510 is coupled to ground 508 and to a network of resistors 502, 504, and 506. The network of resistors is coupled to an input 501 and is used to enable/disable the whole circuitry.

The remainder of circuit 500 comprises an input 515 that is coupled to a transient voltage suppression (TVS) diode 522, which is used to protect electronics from voltage spikes. From there, a variety of resistors (524, 526, 532, 530, 534, 536, 538, 540) and capacitors (528, 542, 544) are used to couple to operational amplifier 550. The output of operational amplifier 550 is coupled to ground 554 and a capacitor 546 an output 560.

Circuit 500 detects an imbalance in current between the neutral line and the ground line, which can be indicative of an earth fault. An alert can be generated, such as an output 560. In some embodiments, the presence of an earth fault is forwarded to other circuitry to generate an alert.

Figure 6:
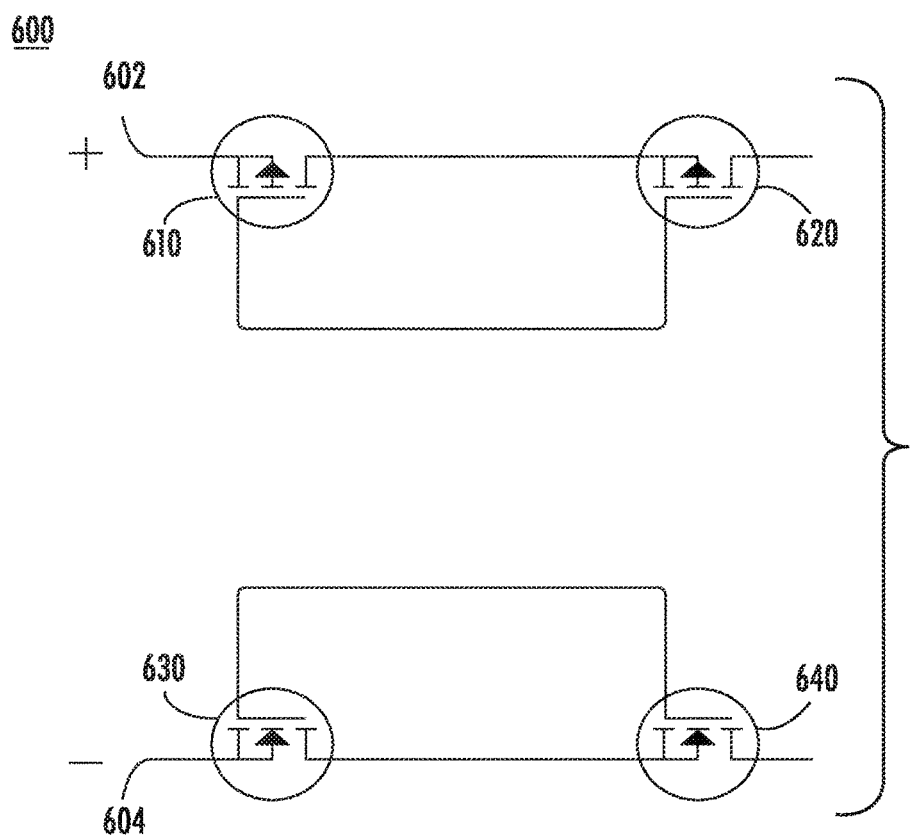
FIG. 6 is an exemplary isolator circuit of one or more embodiments.

With respect to FIG. 6, a circuit diagram of an exemplary isolator 600 is illustrated. As described above, isolator 600 can be present in each device (such as devices 120 through 190) of a loop. Isolator 600 is merely exemplary and other types of isolator circuits can be used.

As explained above, an isolator can be included in each device in a loop. The isolator serves to isolate the different sections of the loop. Isolator 600 comprises four transistors, 610, 620, 630, and 640. Positive line 602 is coupled to transistors 610 and 620, while negative line 604 is coupled to transistors 630 and 640. In some embodiments, transistors 610 and 620 are P-type metal oxide semiconductor field effect transistors (MOSFET) while transistors 630 and 640 are N-type MOSFETs. Transistors 610 and 620 can be coupled together, such that they can both be switched on and off together. In a similar manner, transistors 630 and 640 can be coupled together.

While the above described embodiment describes the use of MOSFETs, it should be understood that any type of device that has switching capabilities can be used. It also should be understood that other configurations are possible for use as isolating circuits.

Figure 3:
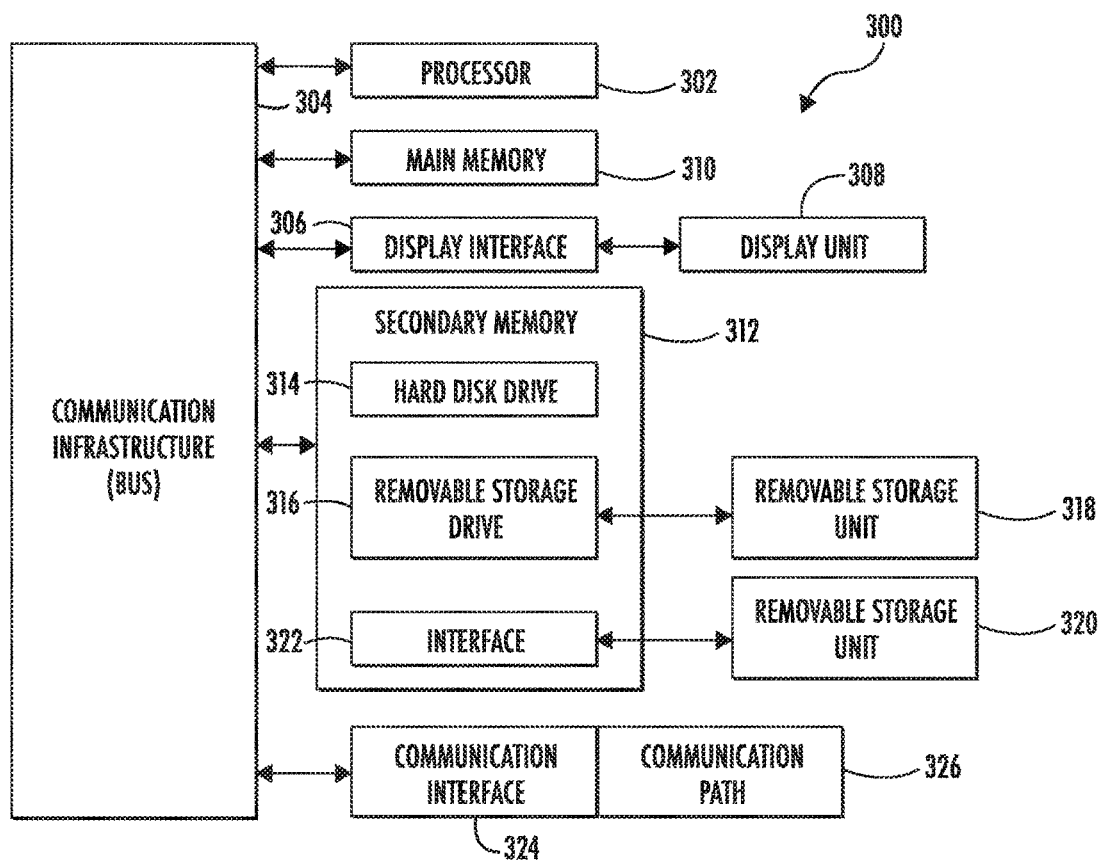
FIG. 3 is a block diagram illustrating an exemplary computer system.

FIG. 3 depicts a high-level block diagram of a computer system 300, which can be used to implement one or more embodiments. More specifically, computer system 300 can be used to implement hardware components of systems capable of performing methods described herein. Although one exemplary computer system 300 is shown, computer system 300 includes a communication path 326, which connects computer system 300 to additional systems (not depicted) and can include one or more wide area networks (WANs) and/or local area networks (LANs) such as the Internet, intranet(s), and/or wireless communication network(s). Computer system 300 and additional system are in communication via communication path 326, e.g., to communicate data between them. While numerous components are illustrated in FIG. 3, some embodiments might not include every illustrated component.

Computer system 300 includes one or more processors, such as processor 302. Processor 302 is connected to a communication infrastructure 304 (e.g., a communications bus, cross-over bar, or network). Computer system 300 can include a display interface 306 that forwards graphics, textual content, and other data from communication infrastructure 304 (or from a frame buffer not shown) for display on a display unit 308. Computer system 300 also includes a main memory 310, preferably random access memory (RAM), and can also include a secondary memory 312. Secondary memory 312 can include, for example, a hard disk drive 314 and/or a removable storage drive 316, representing, for example, a floppy disk drive, a magnetic tape drive, or an optical disc drive. Hard disk drive 314 can be in the form of a solid state drive (SSD), a traditional magnetic disk drive, or a hybrid of the two. There also can be more than one hard disk drive 314 contained within secondary memory 312. Removable storage drive 316 reads from and/or writes to a removable storage unit 318 in a manner well known to those having ordinary skill in the art. Removable storage unit 318 represents, for example, a floppy disk, a compact disc, a magnetic tape, or an optical disc, etc. which is read by and written to by removable storage drive 316. As will be appreciated, removable storage unit 318 includes a computer-readable medium having stored therein computer software and/or data.

In alternative embodiments, secondary memory 312 can include other similar means for allowing computer programs or other instructions to be loaded into the computer system. Such means can include, for example, a removable storage unit 320 and an interface 322. Examples of such means can include a program package and package interface (such as that found in video game devices), a removable memory chip (such as an EPROM, secure digital card (SD card), compact flash card (CF card), universal serial bus (USB) memory, or PROM) and associated socket, and other removable storage units 320 and interfaces 322 which allow software and data to be transferred from the removable storage unit 320 to computer system 300.

Computer system 300 can also include a communications interface 324. Communications interface 324 allows software and data to be transferred between the computer system and external devices. Examples of communications interface 324 can include a modem, a network interface (such as an Ethernet card), a communications port, or a PC card slot and card, a universal serial bus port (USB), and the like. Software and data transferred via communications interface 324 are in the form of signals that can be, for example, electronic, electromagnetic, optical, or other signals capable of being received by communications interface 324. These signals are provided to communications interface 324 via communication path (i.e., channel) 326. Communication path 326 carries signals and can be implemented using wire or cable, fiber optics, a phone line, a cellular phone link, an RF link, and/or other communications channels.

In the present description, the terms "computer program medium," "computer usable medium," and "computer-readable medium" are used to refer to media such as main memory 310 and secondary memory 312, removable storage drive 316, and a hard disk installed in hard disk drive 314. Computer programs (also called computer control logic) are stored in main memory 310 and/or secondary memory 312. Computer programs also can be received via communications interface 324. Such computer programs, when run, enable the computer system to perform the features discussed herein. In particular, the computer programs, when run, enable processor 302 to perform the features of the computer system. Accordingly, such computer programs represent controllers of the computer system. Thus it can be seen from the forgoing detailed description that one or more embodiments provide technical benefits and advantages.

Figure 4:
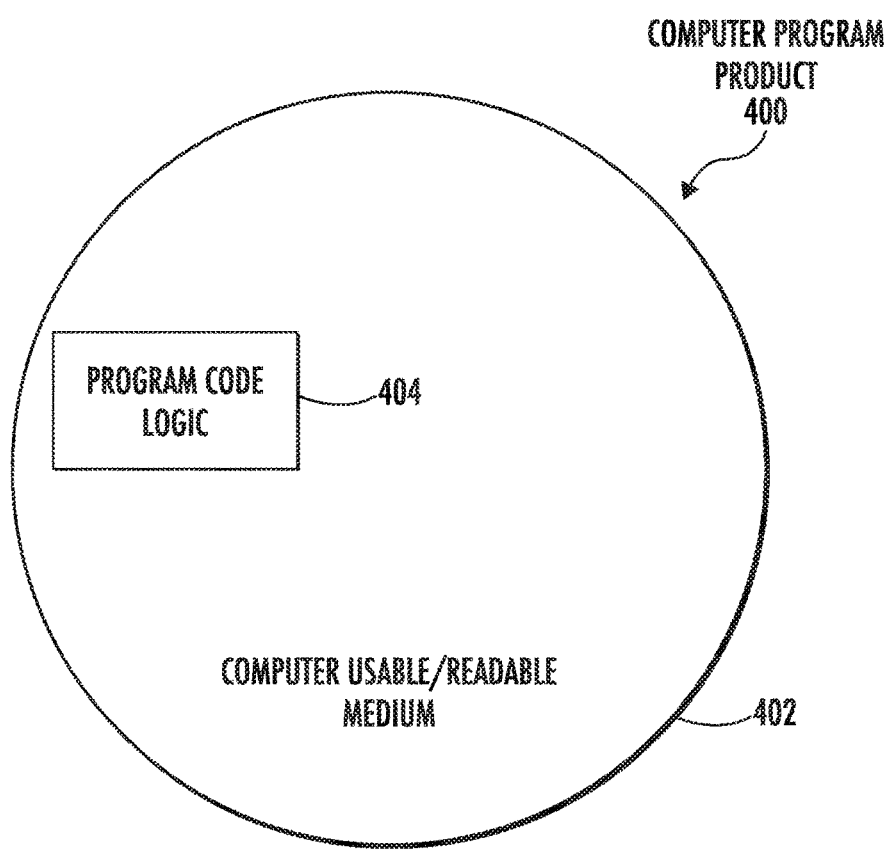
FIG. 4 illustrates a computer program product.

Referring now to FIG. 4, a computer program product 400 in accordance with an embodiment that includes a computer-readable storage medium 402 and program instructions 404 is generally shown.

Embodiments can be a system, a method, and/or a computer program product. The computer program product can include a computer-readable storage medium (or media) having computer-readable program instructions thereon for causing a processor to carry out aspects of embodiments of the present invention.

The computer-readable storage medium can be a tangible device that can retain and store instructions for use by an instruction execution device. The computer-readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers, and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out embodiments can include assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer-readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer-readable program instructions by utilizing state information of the computer-readable program instructions to personalize the electronic circuitry, in order to perform embodiments of the present invention.

Aspects of various embodiments are described herein with reference to flowchart illustrations and/or block diagrams of methods, apparatus (systems), and computer program products according to various embodiments. It will be understood that each block of the flowchart illustrations and/or block diagrams, and combinations of blocks in the flowchart illustrations and/or block diagrams, can be implemented by computer-readable program instructions.

These computer-readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions can also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
upon the detection of an earth fault within a loop comprising a plurality of devices, isolating a first device within the loop;
isolating a second device within the loop;
while the first device and the second device are isolated, determining if the earth fault still exists;
if the earth fault no longer exists, then determining that the earth fault is located between the first device and the second device; and
iterating the isolating and determining through each device within the loop, wherein the iterating comprises:
assigning a unique index number to each device of the plurality of devices in the loop;
starting a counter N at the first unique index number;
isolating device N and device N+1 by opening an isolator in device N and opening an isolator in device N+1; and
in the event the earth fault still exists, removing the isolation between device N and N+1 and incrementing N.

2. The method of claim 1 wherein:
the loop further comprises a controller; and
the controller performs the detection of the earth fault.

3. The method of claim 1 wherein the iterating further comprises:
repeating the isolating and incrementing steps until the ground fault is no longer detected.

4. The method of claim 1 wherein the iterating further comprises:
repeating the isolating and incrementing steps until N is equal to the number of devices in the loop.

5. The method of claim 1 wherein detecting the earth fault comprises determining if current flowing through a positive leg of the loop is equal to the current flowing through a negative leg of the loop.

6. A system comprising:
a loop comprising a plurality of devices, each device including an isolator; and
a controller configured to:
upon the detection of an earth fault within a loop comprising a plurality of devices, isolate a first device within the loop;
isolate a second device within the loop;
while the first device and the second device are isolated, determine if the earth fault still exists;
if the earth fault no longer exists, then determine that the earth fault is located between the first device and the second device;
wherein the controller is configured to iterate the isolating and determining through each device within the loop;
wherein the iterating comprises:
assigning a unique index number to each device of the plurality of devices in the loop;
starting a counter N at the first unique index number;
isolating device N and device N+1 by opening an isolator in device N and opening an isolator in device N+1;
in the event the earth fault still exists, removing the isolation between device N and N+1 and incrementing N; and
repeating the isolating and incrementing steps until the ground fault is no longer detected.

7. The system of claim 6 wherein the controller is further configured to:
determine a number of devices in the loop.

8. The system of claim 6 wherein:
each device in the loop includes an isolator comprising a plurality of switches configured to isolate the device from other devices in the loop.

9. A computer program product, the computer program product comprising a computer readable storage medium having program instructions embodied therewith, wherein the computer readable storage medium is not a transitory signal per se, the program instructions executable by a processor to cause the processor to:
upon the detection of an earth fault within a loop comprising a plurality of devices, each device including an isolator, isolate a first device within the loop;
isolate a second device within the loop;
while the first device and the second device are isolated, determine if the earth fault still exists; and
if the earth fault no longer exists, then determine that the earth fault is located between the first device and the second device;
wherein the program instructions are further configured to:
iterate the isolating and determining through each device within the loop;
determine a number of devices in the loop; wherein:
the iterating comprises:
assigning a unique index number to each device of the plurality of devices in the loop;
starting a counter N at the first unique index number;
isolating device N and device N+1 by opening an isolator in device N and opening an isolator in device N+1; and
in the event the earth fault still exists, removing the isolation between device N and N+1 and incrementing N.

10. The computer program product of claim 9 wherein the iterating further comprises:
repeating the isolating and incrementing steps until the ground fault is no longer detected; or
repeating the isolating and incrementing steps until N is equal to the number of devices in the loop.

* * * * *